(12) United States Patent
Boettiger et al.

(10) Patent No.: US 6,784,975 B2
(45) Date of Patent: Aug. 31, 2004

(54) METHOD AND APPARATUS FOR IRRADIATING A MICROLITHOGRAPHIC SUBSTRATE

(75) Inventors: Ulrich C. Boettiger, Boise, ID (US); Scott L. Light, Boise, ID (US); William T. Rericha, Boise, ID (US); Craig A. Hickman, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 211 days.

(21) Appl. No.: 09/945,167

(22) Filed: Aug. 30, 2001

(65) Prior Publication Data

US 2003/0044693 A1 Mar. 6, 2003

(51) Int. Cl.[7] .................. G03B 27/42; G03B 27/54; G03B 27/32
(52) U.S. Cl. .................. 355/53; 355/67; 355/77
(58) Field of Search .................. 355/53, 55, 67, 355/68, 77, 72; 430/30; 250/492.2

(56) References Cited

U.S. PATENT DOCUMENTS

| | | |
|---|---|---|
| 4,988,188 A | 1/1991 | Ohta |
| 5,142,132 A | 8/1992 | MacDonald et al. |
| 5,194,893 A | 3/1993 | Nishi |
| 5,300,971 A | 4/1994 | Kudo |
| 5,436,464 A | 7/1995 | Hayano et al. |
| 5,602,620 A | 2/1997 | Miyazaki et al. |
| 5,631,721 A | 5/1997 | Stanton et al. |
| 5,661,546 A * | 8/1997 | Taniguchi .................. 355/53 |
| 5,684,566 A | 11/1997 | Stanton |
| 5,721,608 A * | 2/1998 | Taniguchi .................. 355/53 |
| 5,796,467 A * | 8/1998 | Suzuki .................. 355/53 |
| 5,907,392 A | 5/1999 | Makinouchi |
| 5,969,800 A | 10/1999 | Makinouchi |
| 6,084,244 A * | 7/2000 | Saiki et al. .................. 250/548 |
| 6,188,464 B1 | 2/2001 | Makinouchi |
| 6,215,578 B1 | 4/2001 | Lin |
| 6,251,550 B1 | 6/2001 | Ishikawa |
| 6,259,513 B1 | 7/2001 | Gallatin et al. |
| 6,285,440 B1 | 9/2001 | Takahashi |
| 6,291,110 B1 | 9/2001 | Cooper et al. |
| 6,379,867 B1 | 4/2002 | Mei et al. |

OTHER PUBLICATIONS

Fukuda, H. et al., "Improvement of defocus tolerance in a half–micron optical lithography by the focus latitude enhancement exposure method: Simulation and experiment," J. Vac. Sci. Technol B. vol. 7 No. 4, Jul./Aug. 1989, pp. 667–674, 8 pages.

Texas Instruments Incorporated, "What the Industry Experts Say About Texas Instruments Digital MicroMirror Display (DMD) Technology," 6/94, (2 pages).

(List continued on next page.)

Primary Examiner—Alan Mathews
(74) Attorney, Agent, or Firm—Perkins Coie LLP (57) ABSTRACT

A method and apparatus for exposing a radiation-sensitive material of a microlithographic substrate to a selected radiation. The method can include directing the radiation along a radiation path in a first direction toward a reticle, passing the radiation from the reticle and to the microlithographic substrate along the radiation path in a second direction, and moving the reticle relative to the radiation path along a reticle path generally normal to the first direction. The microlithographic substrate can move relative to the radiation path along a substrate path having a first component generally parallel to the second direction, and a second component generally perpendicular to the second direction. The microlithographic substrate can move generally parallel to and generally perpendicular to the second direction in a periodic manner while the reticle moves along the reticle path to change a relative position of a focal plane of the radiation.

70 Claims, 5 Drawing Sheets

OTHER PUBLICATIONS

Hamamatsu Photonics K.K., "PPM—Programmable Phase Modulator," 4 pages, Sept. 2000, <http://www.hamamatsu.com>.

CRL Opto Limited, LSC2–G Datasheet, 4 pages, 2002, <http://www.crlopto.com/products/datasheets/files/LCS2–datasheet.pdf>.

Boulder Nonlinear Systems, "Liquid Crystal Rotators—Ferroelectric and Nematic," 2 pages, <http://www.bnonlinear.com/papers/rotators.pdf>.

Boulder Nonlinear Systems, "Liquid Crystal Shutters / Variable Optical Attenuaters—Ferroelectric and Nematic," 2 pages, <http://www.bnonlinear.com/papers/shutters.pdf>.

Boulder Nonlinear Systems, "512×512 Multi–level/Analog Liquid Crystal Spatial Light Modulator," 2 pages, <http://www.bnonlinear.com/papers/512SLM.pdf>.

Boulder Nonlinear Systems, "256×256 Multi–level/Analog Liquid Crystal Spatial Light Modulator," 2 pages, <http://www.bnonlinear.com/papers/256SLM.pdf>.

Digital Optics Corporation, "Pattern Generators," 1 page, 2002, retrieved from the Internet on Jul. 30, 2003, <http://www.digitaloptics.com/products_ind.asp?pid=55>.

Micro–Optics, Inc., "Polarzation Maintaining Faraday Rotator (PMFR)," 1 page, retrieved from the Internet on Jul. 30, 2003, <http://www.microopticsinc.com/PMFR.html>.

Fmarsari, M. et al., "Microfabrication by use of a spatial light modulator in the ultraviolet: experimental results," Optics Letters, vol. 24, No. 8, pp. 549–550, Apr. 15, 1999, Optical Society of America, Washington, DC.

U.S. patent application Ser. No. 10/684,794, Mackey et al., filed Oct. 14, 2003.

* cited by examiner

METHOD AND APPARATUS FOR IRRADIATING A MICROLITHOGRAPHIC SUBSTRATE

This application relates to material disclosed in U.S. application Ser. No. 09/945,316 (attorney docket number 10829.8547US) titled "Method and Apparatus for Controlling Radiation Beam Intensity Directed to Microlithographic Substrates," filed on Aug. 30, 2001 and incorporated herein in its entirety by reference.

BACKGROUND

The present invention is directed toward methods and apparatuses for irradiating a microlithographic substrate, and in particular, methods and apparatuses for irradiating the microlithographic substrate while moving it axially relative to a radiation source. Microelectronic features are typically formed in microelectronic substrates (such as semiconductor wafers) by selectively removing material from the wafer and filling in the resulting openings with insulative, semiconductive, or conductive materials. One typical process includes depositing a layer of radiation-sensitive photoresist material on the wafer, then positioning a patterned mask or reticle over the photoresist layer, and then exposing the masked photoresist layer to a selected radiation. The wafer is then exposed to a developer, such as an aqueous base or a solvent. In one case, the photoresist layer is initially generally soluble in the developer, and the portions of the photoresist layer exposed to the radiation through patterned openings in the mask change from being generally soluble to become generally resistant to the developer (e.g., so as to have low solubility). Alternatively, the photoresist layer can be initially generally insoluble in the developer, and the portions of the photoresist layer exposed to the radiation through the openings in the mask become more soluble. In either case, the portions of the photoresist layer that are resistant to the developer remain on the wafer, and the rest of the photoresist layer is removed by the developer to expose the wafer material below.

The wafer is then subjected to etching or metal disposition processes. In an etching process, the etchant removes exposed material, but not material protected beneath the remaining portions of the photoresist layer. Accordingly, the etchant creates a pattern of openings (such as grooves, channels, or holes) in the wafer material or in materials deposited on the wafer. These openings can be filled with insulative, conductive, or semiconductive materials to build layers of microelectronic features on the wafer. The wafer is then singulated to form individual chips, which can be incorporated into a wide variety of electronic products, such as computers and other consumer or industrial electronic devices.

As the size of the microelectronic features formed in the wafer decreases (for example, to reduce the size of the chips placed in the electronic devices), the size of the features formed in the photoresist layer must also decrease. This requires focusing the radiation impinging on the photoresist layer more sharply. However, as the radiation is more sharply focused, it loses depth of focus. As a result, only the top stratum of the photoresist layer may be adequately exposed to the sharply-focused radiation, and the lower strata of the photoresist layer may not be adequately exposed. Accordingly, the edges of those portions of the photoresist layer that remain on the wafer after the wafer is exposed to the solvent can become indistinct. This in turn can adversely affect the definition of the microelectronic features formed on the wafer.

One approach to addressing the foregoing problem (a "stepper" approach) has been to expose one or more relatively large fields of the wafer to the incoming radiation, and then move the wafer axially relative to the incoming radiation so that the focal plane of the radiation passes through several strata of the photoresist layer. This process is generally referred to as "focus drilling." In one specific application of this principle (termed focus latitude enhancement exposure or "FLEX"), the wafer is placed on a stepper stage and one field of the wafer is exposed to light passing through a mask and focused at a given depth. The focal plane is then changed to be at a different depth, and the field is re-exposed. This process is repeated sequentially for a number of focal plane depths. Alternatively, the wafer can be moved axially as it is being exposed. In either case, the stepper then moves the wafer to expose another field of the wafer and the process is repeated until all the fields of the wafer are exposed. Further details of the FLEX process are disclosed in a publication titled "Improvement of Defocus Tolerance in a Half-Micron Optical Lithography by the Focus Latitude Enhancement Exposure Method: Simulation and Experiment" (Hiroshi Fukuda et al., July 1989). One drawback with the foregoing method is that it is performed on a stepper apparatus. Accordingly, the resolution of the features may be limited because an entire field of the wafer must be accurately imaged with each exposure.

Another approach to addressing the foregoing problem (a "scanner" approach) is to move the wafer along an inclined path as the wafer and the mask scan past each other to align successive portions of the mask with corresponding successive portions of the wafer passing below. U.S. Pat. No. 5,194,893 to Nishi discloses a scanner method for altering the axial position of the depth of focus relative to the photoresist layer as the wafer moves relative to the mask. According to this method, the wafer is canted relative to the incoming radiation so that the focal plane passes through more than one strata of the photoresist layer as the wafer and the mask move relative to each other. The scanner approach can be more accurate than the stepper approach because only a small portion of the mask must be imaged at any given time. However, a drawback with the foregoing approach is that it may not provide the desired level of control over the position of the focal plane.

SUMMARY

The present invention is directed toward methods and apparatuses for exposing a radiation-sensitive material of a microlithographic substrate to a selected radiation. In one embodiment, the method can include directing the radiation along a reticle radiation path segment toward a reticle. The method can further include passing the radiation from the reticle and to the microlithographic substrate along a substrate radiation path segment. The reticle is then moved along a reticle path generally normal to the reticle radiation path segment, and the microlithographic substrate is moved along a substrate path. The substrate path has a first component generally parallel to the substrate radiation path segment and a second component generally perpendicular to the substrate radiation path segment. The microlithographic substrate moves generally parallel to and generally perpendicular to the substrate radiation path segment toward and away from the reticle while the reticle moves along the reticle path. In a further aspect of this embodiment, the method can include oscillating the microlithographic substrate toward and away from the reticle along an axis generally parallel to the substrate radiation path segment in a periodic manner. In yet a further aspect of this method, the radiation can include a beam having a beam width at the microlithographic substrate and the microlithographic substrate can be moved for one period during the time the microlithographic substrate moves transverse to the beam by a distance of one beam width or about one beam width.

The invention is also directed toward apparatuses for exposing a radiation-sensitive material of a microlithographic substrate to a selected radiation. In one aspect of the invention, the apparatus can include a source of radiation positioned to direct a selected radiation along a radiation path. The apparatus can further include a reticle positioned in the radiation path with the reticle being configured to pass the radiation toward a microlithographic substrate. The reticle is coupled to at least one actuator to move relative to the radiation path in a direction generally perpendicular to the radiation path. The apparatus can further include a substrate support having a support surface positioned to support a microlithographic substrate in the radiation path with the microlithographic substrate receiving radiation passing from the reticle. The substrate support can be coupled to at least one actuator to move relative to the radiation path along a substrate support path having a first component generally parallel to the radiation path and a second component generally perpendicular to the radiation path. The substrate support can be movable along both the first and second components of the substrate support path while the reticle moves along the reticle path.

In further embodiments, the apparatus can include a substrate support having a support surface positioned to support a microlithographic substrate in the radiation path with a surface of the microlithographic substrate at least approximately normal to the radiation path. The apparatus can further include a reticle positioned in the radiation path and oriented at a first non-normal angle relative to the radiation path. The reticle can be coupled to an actuator to move along a reticle path inclined relative to the substrate path by a second non-normal angle approximately equal to the first non-normal angle. Alternatively, the substrate support can be configured to support the microlithographic substrate at a first non-normal angle relative to the radiation path, and the reticle can be configured to move along a reticle path oriented at a second non-normal angle relative to radiation path.

DETAILED DESCRIPTION

The present disclosure describes methods and apparatuses for controllably exposing a radiation-sensitive material of a microlithographic substrate to a selected radiation. The term "microlithographic substrate" is used throughout to include substrates upon which and/or in which microelectronic circuits or components, data storage elements or layers, vias or conductive lines, micro-optic features, micromechanical features, and/or microbiological features are or can be fabricated using microlithographic techniques. Many specific details of certain embodiments of the invention are set forth in the following description and in FIGS. 1–5 to provide a thorough understanding of these embodiments. One skilled in the art, however, will understand that the present invention may have additional embodiments, and that the invention may be practiced without several of the details described below.

Figure 1:
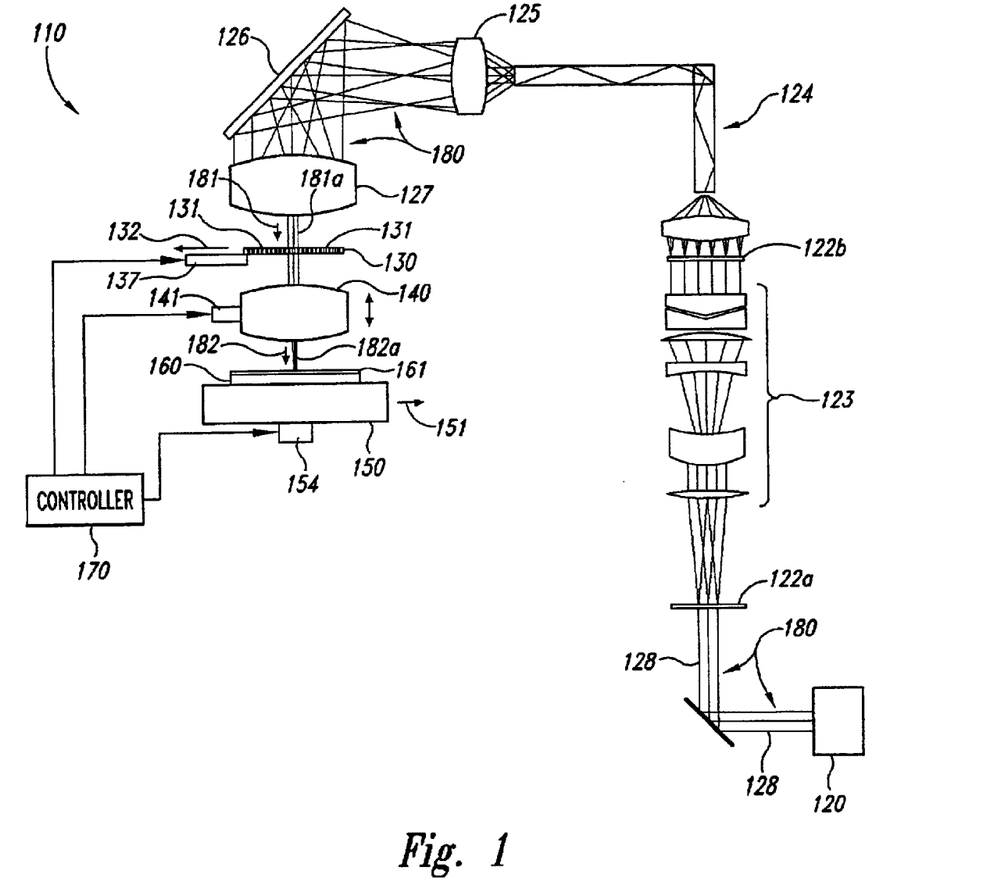
FIG. 1 is an illustration of an apparatus in accordance with an embodiment of the invention with components shown schematically.

FIG. 1 schematically illustrates an apparatus 110 for controllably irradiating a microlithographic substrate 160 in accordance with an embodiment of the invention. The apparatus 110 can include a radiation source 120 that directs an electromagnetic radiation beam 128 along a radiation path 180 toward the microlithographic substrate 160. Optionally, the radiation beam 128 can pass through one or more diffractive elements 122 (two are shown in FIG. 1 as diffractive elements 122a and 122b), and through a lens system 123 configured to shape and/or magnify the radiation emitted by the source 120. Optionally, the apparatus 110 can further include a light tube 124 positioned to generate a plurality of images of the radiation source 120. The light tube 124 and/or a sizing lens 125 can size the radiation beam 128, which is then directed by a mirror 126 in a first direction 181 through a focusing lens 127 and to a reticle or mask 130 along a reticle radiation path segment 181a.

The reticle 130 can include reticle apertures 131 through which the radiation passes to form an image on the microlithographic substrate 160. Before the radiation reaches the substrate 160, it passes through a reduction lens system 140, which reduces the image pattern defined by the reticle 130 to a size corresponding to the size of the features to be formed on the microlithographic substrate 160. The radiation exiting the reduction lens system 140 travels along a substrate radiation path segment 182a and impinges on a radiation-sensitive material (such as a photoresist layer 161) of the microlithographic substrate 160 in a second direction 182 to form an image on the layer 161. In one embodiment, the beam 128 impinging on the layer 161 can have a generally rectangular shape with a width of from about 5 mm. to about 8 mm. and a length of about 26 mm. at the microlithographic substrate 160. In other embodiments, the beam 128 incident on the layer 161 can have other shapes and sizes. In one embodiment, the radiation can have a wavelength in the range from about 157 nanometers or less (for example, 13 nanometers) to a value of about 365 nanometers or more. For example, the radiation can have a wavelength of 193 nanometers. In other embodiments, the radiation can have other wavelengths, such as 248 nanometers, suitable for exposing the layer 161 on the microlithographic substrate 160.

The microlithographic substrate 160 is supported on a substrate support 150. The substrate support 150 moves along a substrate support path 151 and the reticle 130 moves in the opposite direction along a reticle path 132 to scan the image produced by the reticle 130 across the layer 161 while the position of the radiation beam 128 remains fixed. Accordingly, the substrate support 150 can be coupled to a support actuator 154 and the reticle 130 can be coupled to a reticle actuator 137. As the reticle 130 moves opposite the microlithographic substrate 160, the radiation source 120 flashes to irradiate successive portions of the microlithographic substrate 160 with corresponding successive images produced by the reticle 130 until an entire field of the microlithographic substrate 160 is scanned. In one embodiment, the radiation source 120 can flash at a rate of about 20 cycles during the time required for the microlithographic substrate 160 to move by one beam width (e.g., by from about 5 mm. to about 8 mm.). In other embodiments, the radiation source 120 can flash at other rates. In any of these embodiments, the radiation source 120 can flash at the same rate throughout the scanning process (assuming the reticle 130 and the substrate support 150 each move at a constant rate) to uniformly irradiate each field of the microlithographic substrate 160. In still further embodiments, the radiation source 120 can deliver a continuous radiation beam 128.

In one embodiment, each field of the microlithographic substrate 160 can correspond to one or more chips or dice, and in other embodiments, the field can have other sizes. After a field is exposed, the substrate support 150 can "step" the microlithographic substrate 160 laterally to align another field with the radiation beam 128, and the scan process described above can be repeated until the entire microlithographic substrate layer 161 has been exposed to the radiation.

In a further aspect of this embodiment, a controller 170 is operatively coupled to the reticle 130 (or the reticle actuator 137) and the substrate support 150 (or the support actuator 154). Optionally, the controller 170 can also be coupled to the reduction lens system 140. Accordingly, the controller 170 can control and coordinate the relative movement between these elements, as described in greater detail below.

Figure 2:
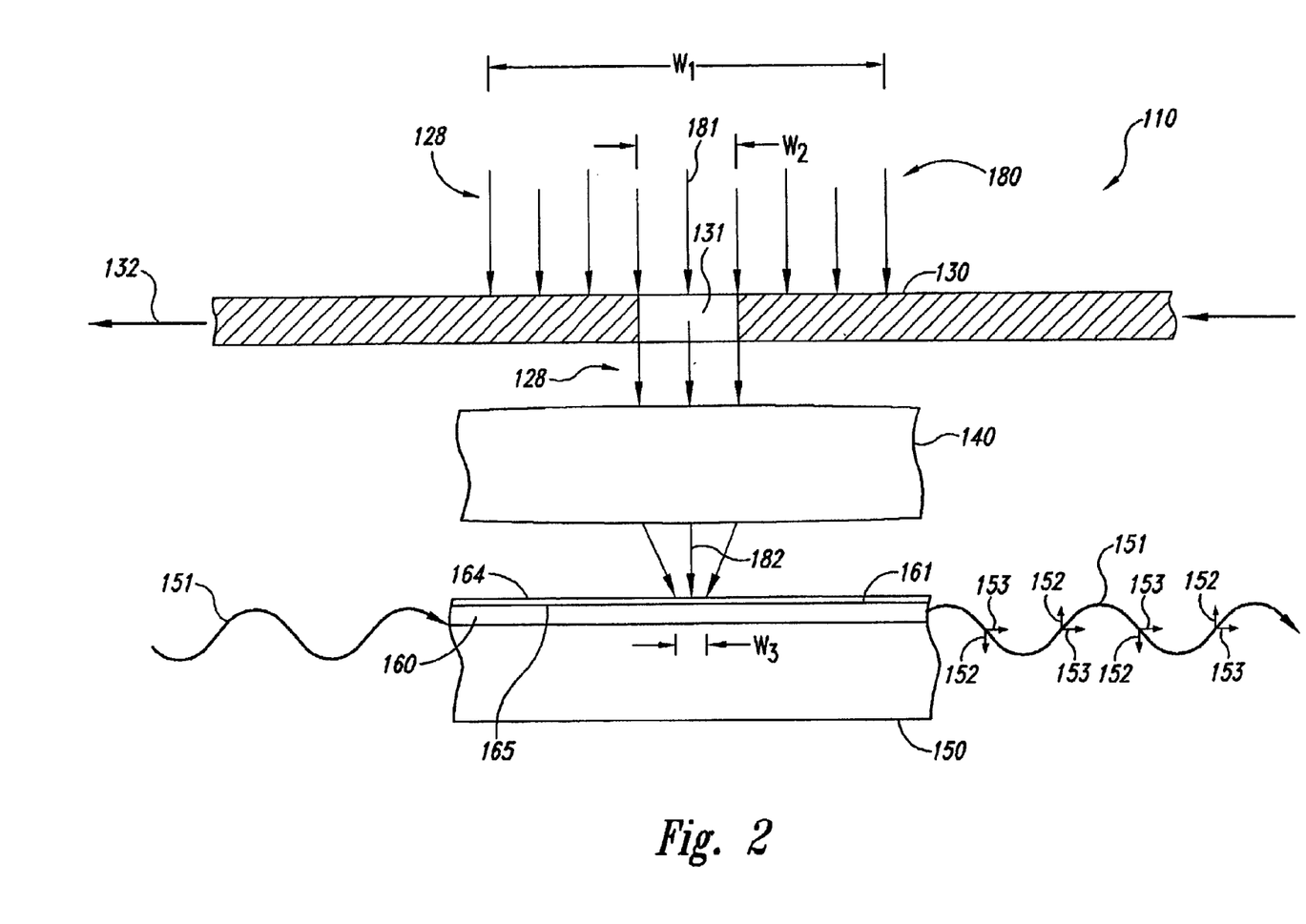
FIG. 2 is an enlarged view of a portion of the apparatus illustrated in FIG. 1 in accordance with an embodiment of the invention.

FIG. 2 is an enlarged schematic view of a portion of the apparatus 110 described above with reference to FIG. 1. The radiation beam 128 incident on the reticle 130 has a width $W_1$. The portion of the reticle 130 shown in FIG. 2 has an aperture 131 with a width $W_2$ through which the radiation passes. For purposes of illustration, only one aperture 131 is shown in FIG. 2, although it will be understood that the reticle 130 typically includes many apertures. The reduction lens system 140 reduces the size of the beam passing through the aperture 131 (for example, by a factor of 4) so that the beam and corresponding image have a width $W_3$ at the layer 161 of the microlithographic substrate 160.

As the reticle 130 moves along the reticle path 132 in a direction approximately normal to the first direction 181 of the incident radiation, the substrate support 150 moves along the substrate support path 151, carrying the microlithographic substrate 160 along a parallel substrate path. The substrate support path 151 can have a first component 152 generally aligned with the second direction 182 of the radiation. The substrate support path 151 can also have a second component 153 generally perpendicular to the first component 152 and generally parallel to (but opposite) the reticle path 132.

In one aspect of the embodiment shown in FIG. 2, the first component 152 of the substrate support path 151 oscillates in a periodic manner so that the microlithographic substrate 160 moves toward and away from the reticle 130 as the reticle 130 and the microlithographic substrate 160 scan past each other. Accordingly, the focal plane of the radiation beam 128 impinging on the microlithographic substrate 160 can pass through several depth-wise planes within the thickness of the layer 161 as the microlithographic substrate 160 and the reticle 130 move relative to each other. For example, the focal plane can move from a position at or proximate to an outer surface 164 of the layer 161 to a position at or proximate to an inner surface 165 of the layer 161 thereby exposing the entire thickness of the layer 161 to focused radiation. In other embodiments, the focal plane can move axially by less than the entire thickness of the layer 161 while exposing a greater depth-wise portion of the layer 161 than is possible with a scanner apparatus having a fixed focal plane.

FIGS. 3A–F include traces of the axial position of the microlithographic substrate 160 (on the ordinate axis) as a function of transverse distance (on the abscissa axis) for several substrate support paths 151 (shown as paths 151a–f) in accordance with several embodiments of the invention. The ordinate axis can also represent the degree of focus for a selected plane in the layer 161 (FIG. 2), with zero indicating coincidence of the radiation focal plane and the selected plane of the layer 161. The transverse distance is normalized to correspond to a movement of the microlithographic substrate 160 by one beam width $W_3$ (FIG. 2), measured at the microlithographic substrate 160. Accordingly, a value of "1" on the abscissa axis corresponds to a movement of the microlithographic substrate 160 by one beam width $W_3$.

Substrate support path 151a is a generally sinusoidal path describing a sine function. In this embodiment, the substrate support 150 and the microlithographic substrate 160 (FIG. 2) complete one full cycle during the time the microlithographic substrate 160 moves by one beam width or about one beam width (referred to hereinafter as a "normalized period"). Accordingly, the substrate support 150 moves from a neutral position to its position closest to the reticle 130, then to its position furthest from the reticle 130 and back to the neutral position in the amount of time required for the microlithographic substrate 160 to move by the beam width $W_3$. Path 151b describes a modified cosine motion in which the substrate support 150 dwells at the position furthest from the reticle 130 for a slightly extended period of time. Path 151c describes a straight-line triangular or saw-tooth function for which one cycle is completed within one normalized period.

Figure 3A:
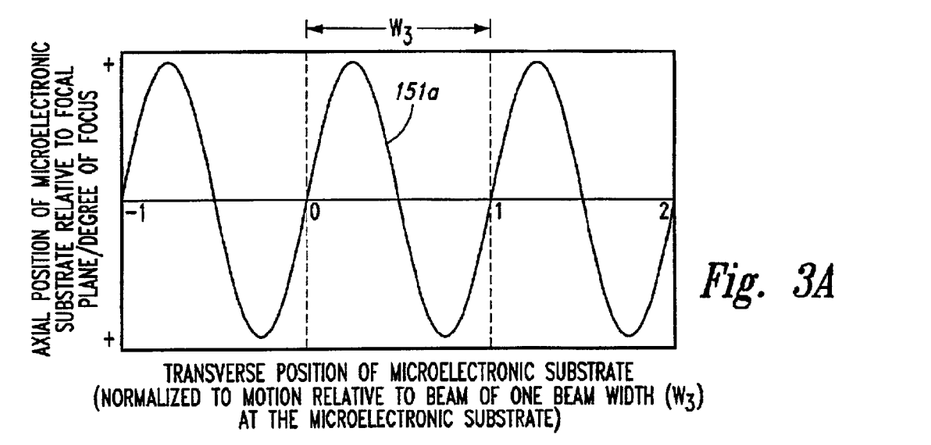
FIGS. 3A–F are schematic illustrations of motion paths of a microlithographic substrate in accordance with several embodiments of the invention.
Figure 3B:
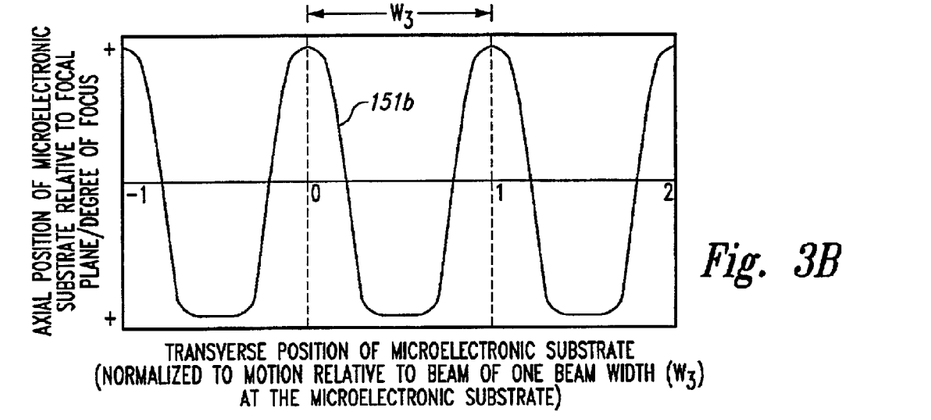
Figure 3C:
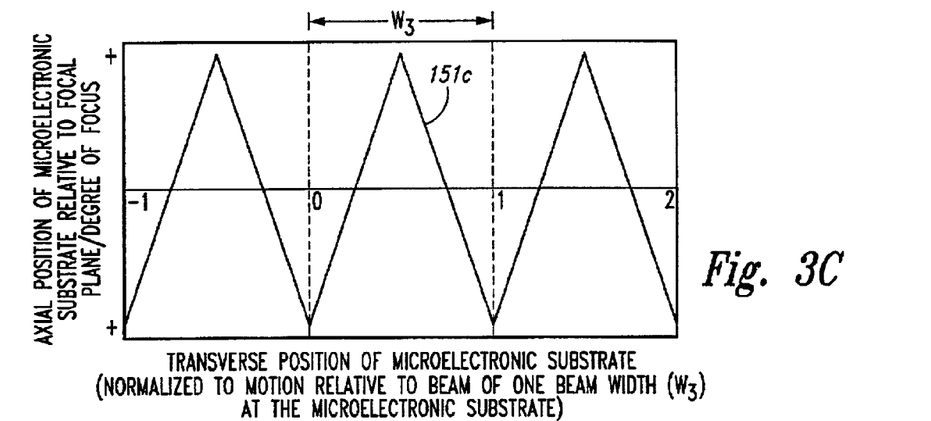
Figure 3D:
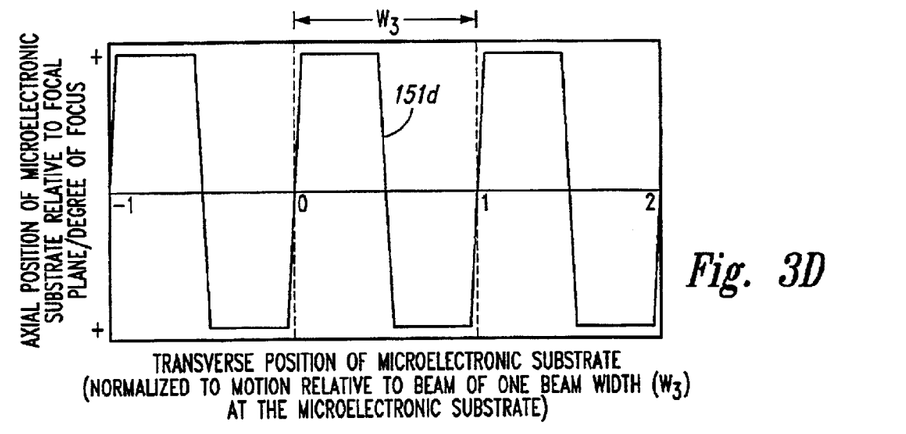
Figure 3E:
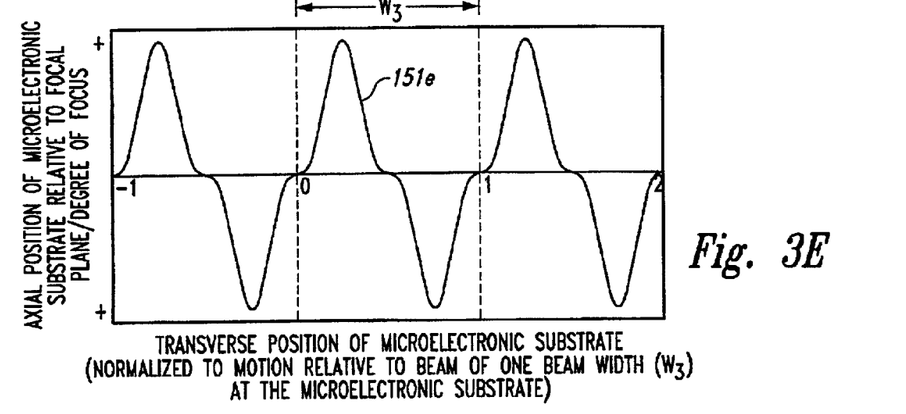
Figure 3F:
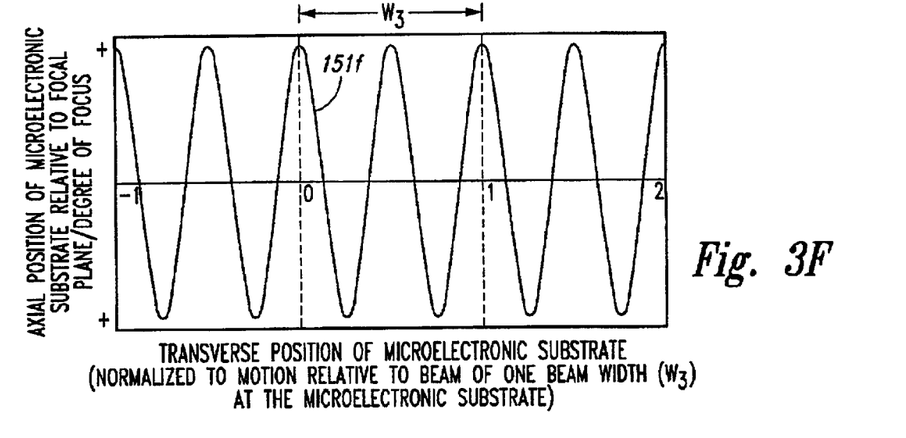

In other embodiments, the substrate support path 151 can have other shapes. For example, path 151d describes an approximately square wave pattern. Path 151e describes a repeated, non-sinusoidal curvilinear function. Path 151f is a cosine wave that completes two cycles in one normalized period.

In other embodiments, the substrate support path 151 can have other shapes. In a further aspect of these embodiments, the paths 151 can be tailored to particular characteristics of the radiation and/or the layer 161 upon which the radiation impinges. For example, (referring now to FIG. 2), it may be desirable to expose the inner strata of the layer 161 (proximate to the inner surface 165) for a longer period of time than the outer strata (proximate to the outer surface 164). Accordingly, the travel path 151 can "dwell" at a lower focal plane, for example, as shown in FIG. 3B by path 151b.

In general, it may be desirable to complete an integer number of path cycles within one normalized period to uniformly expose each successive strip of the layer 161 in the same manner. Accordingly, the path 151 can complete one or two cycles in one normalized period (as shown in FIGS. 3A–F), or other integer number of cycles in other embodiments.

Referring again to FIG. 1, one or more elements of the reduction lens system 140 can be coupled to a lens actuator 141 to move axially relative to the reticle 130 and the substrate support 150 under the control of the controller 170.

Moving elements of the reduction lens system 140 can provide another degree of freedom for positioning the focal plane of the radiation beam 128 relative to the layer 161 on the microlithographic substrate 160. Accordingly, the reduction lens system 140 can move in combination with or in lieu of moving the microlithographic substrate 160 to vary the axial position of the focal plane relative to the layer 161.

One feature of an embodiment of an apparatus and method described above with reference to FIGS. 1–3F is that the microlithographic substrate 160 (and the substrate support 150) can move axially relative to the reticle 130 while the reticle 130 and the microlithographic substrate 160 scan past each other. An advantage of this arrangement is that the focal plane of the radiation passing through the reticle 130 can move axially relative to the layer 161 to effectively increase the depth of focus of the radiation and more thoroughly expose the strata of the layer 161 to the radiation. A further advantage of this arrangement is that the axial motion can be implemented on a scanning apparatus which, because only a portion of the reticle pattern need be focused at any point in time, can produce microlithographic features with a higher degree of resolution than are available by conventional focus drilling methods.

Another feature of this arrangement is that the motion of the substrate support 150 can follow an infinite number of controlled, periodic paths. Accordingly, the motion of the substrate support 150 can be tailored to a particular microlithographic substrate 160 or class of microlithographic substrates 160. For example, if the inner portions of the layer 161 on the microlithographic substrate 160 require additional exposure time, the path can be selected such that the focal plane dwells on the inner portions of the layer 161 for longer than it dwells on the outer portions.

Figure 4:
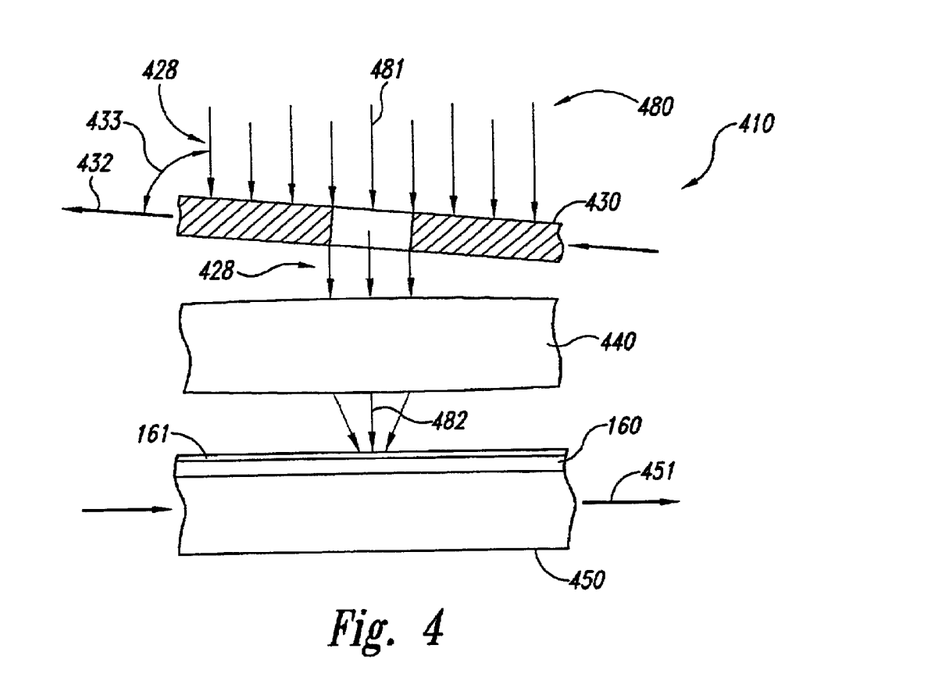
FIG. 4 is a schematic illustration of an apparatus having an inclined reticle that moves along an inclined motion path in accordance with another embodiment of the invention.

FIG. 4 is a partially schematic illustration of a portion of an apparatus 410 that includes a substrate support 450 carrying the microlithographic substrate 160. The apparatus 400 further includes a reticle 430 oriented at a non-normal (i.e., oblique) tilt angle 433 relative to a radiation beam 428 traveling along a radiation path 480 in a first direction 481. The radiation passes through the reticle 430 and through a reducing lens 440 to impinge on the microlithographic substrate 160 in second direction 482.

In a further aspect of this embodiment, the substrate support 450 and the microlithographic substrate 160 travel along a substrate support path 451, and the reticle 430 travels in the opposite direction along a reticle path 432 that is inclined relative to the radiation path 480 by the tilt angle 433 that is generally slightly less than a normal angle. In one aspect of this embodiment, the tilt angle 433 can have a value of about 400 microradians less than a normal angle, and in other embodiments, the tilt angle 433 can have other values. In either embodiment, the reticle 430 can travel along the reticle path 432 at a higher rate of speed than the substrate support 450 travels along the substrate support path 451 to account for the effect of the reduction lens 440. For example, when the reduction lens 440 reduces the size of the image passing through the reticle 430 by a factor of four, the speed of the reticle 430 can be four times as great as the speed of the substrate support 450.

Because the reticle 430 is inclined at the non-normal angle 433 and moves relative to the incoming radiation along the reticle path 432 inclined at the non-normal angle 433, the focal plane of the radiation beam changes axial position relative to the microlithographic substrate 160 as the reticle 430 and the substrate support 450 move past each other. As described above with reference to FIGS. 1–3F, an advantage of this arrangement is that the radiation focal plane can pass through several strata within the layer 161 to more thoroughly expose the layer 161.

Figure 5:
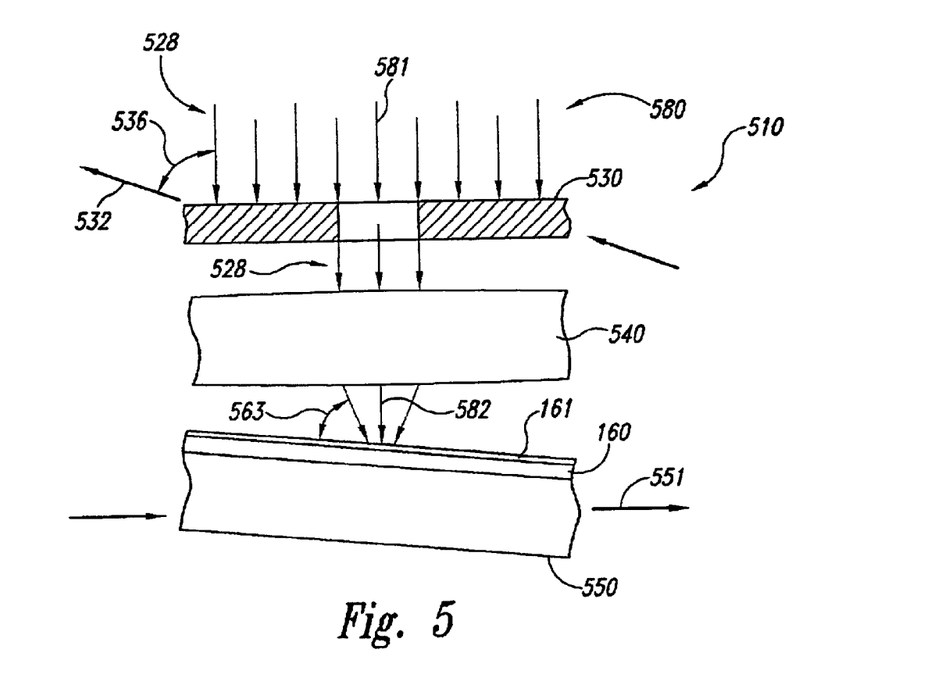
FIG. 5 is a schematic illustration of an apparatus supporting a microlithographic substrate at an incline, and a reticle that travels along an inclined path in accordance with yet another embodiment of the invention.

FIG. 5 is a partially schematic illustration of a portion of an apparatus 510 that includes a substrate support 550 carrying the microlithographic substrate 160. In a further aspect of this embodiment, the substrate support 550 travels along a substrate support path 551 that is oriented approximately normal to radiation traveling along a radiation path 580 in a second direction 582. In a further aspect of this embodiment, the substrate support 550 carries the microlithographic substrate 160 at a non-normal angle 563 relative to the second direction 582 of the incident radiation.

The apparatus 510 further includes a reticle 530 positioned to move in the opposite direction as the substrate support 550. The reticle 530 is positioned approximately normal to an incident radiation beam 528 traveling in a first direction 581, and moves along a reticle path 532 that is inclined at a reticle path angle 536 relative to the first direction 581. In one aspect of this embodiment, the value of the reticle path angle 536 and the substrate tilt angle 563 can be related and can both be slightly less than a normal angle. For example, the complement of the substrate tilt angle 563 can be less than the complement of the reticle path angle 536 by a factor corresponding to the reduction factor of a reduction lens 540 positioned between the reticle 530 and the substrate support 550. In one specific embodiment, the substrate tilt angle 563 can have a value of about 100 microradians less than a normal angle (with a complement of about 100 microradians), the reticle path angle 536 can have a value of about 400 microradians less than a normal angle (with a complement of about 400 microradians), and the reduction lens 540 can reduce the size of an incoming image by a factor of four. In other embodiments, these angles can have different values depending for example, on the power of the reduction lens 540.

An advantage of any of the embodiments described above with reference to FIG. 5 is that the microlithographic substrate 160 can pass through radiation focused at a variety of focal planes as it moves relative to the reticle 530. Accordingly, more than a single depth-wise plane of the layer 161 disposed on the microlithographic substrate 160 can be exposed to focused radiation.

From the foregoing, it will be appreciated that specific embodiments of the invention have been described herein for purposes of illustration, but that various modifications may be made without deviating from the spirit and scope of the invention. For example, any of the refractive elements described above, including the reticle, can be replaced with reflective elements that perform generally the same function. Accordingly, the invention is not limited except as by the appended claims.

We claim:

1. A method for exposing a radiation-sensitive material of a microlithographic substrate to a selected radiation, comprising:

directing the radiation along a reticle radiation path segment toward a reticle;

passing the radiation from the reticle and to the microlithographic substrate along a substrate radiation path segment at the microlithographic substrate;

moving the reticle along a reticle path generally normal to the reticle radiation path segment; and moving the microlithographic substrate relative to the radiation path along a substrate path, the substrate path having a first component generally parallel to the substrate radiation path segment, and the substrate path having a second component generally perpendicular to the substrate radiation path segment, wherein the microlithographic substrate moves generally parallel to and generally perpendicular to the substrate radiation path segment toward and away from the reticle while the reticle moves along the reticle path, and wherein the microlithographic substrate oscillates toward and away from the reticle along a first axis generally parallel to the substrate radiation path segment while the microlithographic substrate simultaneously moves along a second axis generally perpendicular to the substrate radiation path segment.

2. The method of claim 1 wherein the radiation includes a beam having a beam width at the microlithographic substrate, and wherein moving the microlithographic substrate includes oscillating the microlithographic substrate toward and away from the reticle along an axis generally parallel to the substrate radiation path segment, further wherein a motion of the microlithographic substrate is periodic and wherein moving the microlithographic substrate includes moving the microlithographic substrate for one period during the time the microlithographic substrate moves transverse to the beam by a distance of one beam width or about one beam width.

3. The method of claim 1 wherein the radiation includes a beam having a beam width at least proximate to an intersection between the beam and the microlithographic substrate, and wherein moving the microlithographic substrate includes oscillating the microlithographic substrate toward and away from the reticle along an axis generally parallel to the substrate radiation path segment, further wherein a motion of the microlithographic substrate is periodic and wherein moving the microlithographic substrate includes moving the microlithographic substrate for an integer number of periods during the time the microlithographic substrate moves transverse to the beam by a distance of one beam width or about one beam width.

4. The method of claim 1 wherein moving the reticle includes moving the reticle along a reticle path generally normal to the reticle radiation path segment at least proximate to a point where the radiation impinges on the reticle.

5. The method of claim 1 wherein moving the microlithographic substrate includes moving the microlithographic substrate along a substrate path having a first component generally parallel to the substrate radiation path segment of the radiation at least proximate to a point where the radiation strikes the microlithographic substrate, the substrate path having a second component generally perpendicular to the substrate radiation path segment at least proximate to a point where the radiation strikes the microlithographic substrate.

6. The method of claim 1, further comprising selecting the radiation-sensitive material to include a coating of photoresist material.

7. The method of claim 1, further comprising selecting the radiation to have a wavelength of from about 13 nanometers or less to about 365 nanometers.

8. The method of claim 1, further comprising orienting a plane of the reticle approximately normal to the first direction.

9. The method of claim 1 wherein moving the microlithographic substrate includes simultaneously moving the microlithographic substrate parallel to and perpendicular to the second direction.

10. The method of claim 1 wherein moving the reticle includes moving the reticle in a direction opposite to the second component of motion of the microlithographic substrate.

11. The method of claim 1 wherein moving the microlithographic substrate includes moving the microlithographic substrate along a curved path.

12. The method of claim 1 wherein moving the microlithographic substrate includes moving the microlithographic substrate along a straight path having a first segment directed toward the reticle and a second segment directed away from the reticle.

13. The method of claim 1 wherein moving the microlithographic substrate includes moving the microlithographic substrate along a path describing a square wave.

14. The method of claim 1 wherein moving the microlithographic substrate includes moving the microlithographic substrate along a path describing a sinusoidal wave.

15. The method of claim 1 wherein moving the microlithographic substrate includes moving the microlithographic substrate along a path that describes a periodic, triangular profile.

16. The method of claim 1 wherein the microlithographic substrate has first and second fields, and wherein the method further comprises:
aligning the radiation path with the first field;
moving the reticle and the microlithographic substrate relative to each other while the radiation path is aligned with the first field;
repositioning at least one of the microlithographic substrate and the radiation path relative to the other to align the radiation path with the second field; and
moving the reticle and the microlithographic substrate relative to each other while the radiation path is aligned with the second field.

17. The method of claim 1, further comprising selecting the reticle radiation path segment to be approximately parallel to the substrate radiation path segment.

18. The method of claim 1 wherein moving the microlithographic substrate includes moving the microlithographic substrate relative to a focal plane of the radiation passing through the reticle.

19. The method of claim 1 where a reduction lens is positioned between the reticle and the microlithographic substrate and wherein the method further comprises moving the reduction lens axially relative to the microlithographic substrate to move a focal plane of the radiation axially relative to the microlithographic substrate.

20. A method for exposing a radiation-sensitive material of a microlithographic substrate to a selected radiation, comprising:
directing a beam of the radiation along a radiation path in a first direction toward a reticle;
passing the radiation through an aperture of the reticle and to the microlithographic substrate along the radiation path in a second direction, the beam having a beam width at least proximate to an intersection between the beam and the microlithographic substrate;
focusing the radiation toward a focal plane;
moving the reticle relative to the radiation path along a reticle path generally normal to the first direction; and
moving the microlithographic substrate relative to the radiation path and the focal plane along a substrate path, the substrate path having a first component generally parallel to the second direction, the substrate path having a second component generally perpendicular to the second direction, the microlithographic substrate simultaneously moving parallel to and perpendicular to the second direction while the reticle moves along the reticle path, and wherein the microlithographic substrate oscillates in a periodic manner toward and away from the reticle along an axis generally parallel to the second direction, further wherein moving the microlithographic substrate includes moving the microlithographic substrate for an integer number of periods during the time the microlithographic substrate moves transverse to the beam by a distance of approximately one beam width.

21. The method of claim 20 wherein moving the reticle includes moving the reticle along a reticle path generally normal to the first direction of the radiation path at least proximate to a point where the radiation impinges on the reticle.

22. The method of claim 20 wherein moving the microlithographic substrate includes moving the microlithographic substrate along a substrate path having a first component generally parallel to the second direction of the radiation at least proximate to a point where the radiation strikes the microlithographic substrate, the substrate path having a second component generally perpendicular to the second direction of the radiation at least proximate to a point where the radiation strikes the microlithographic substrate.

23. The method of claim 20, further comprising selecting the radiation-sensitive material to include a coating of photoresist material.

24. The method of claim 20, further comprising selecting the radiation to have a wavelength of from about 13 nanometers or less to about 365 nanometers.

25. The method of claim 20, further comprising orienting a plane of the reticle approximately normal to the first direction.

26. The method of claim 20 wherein moving the reticle includes moving the reticle in a direction opposite to the second component of motion of the microlithographic substrate.

27. The method of claim 20 wherein moving the microlithographic substrate includes moving the microlithographic substrate along a curved path.

28. The method of claim 20 wherein moving the microlithographic substrate includes moving the microlithographic substrate along a path describing a sinusoidal wave.

29. The method of claim 20 wherein the microlithographic substrate has first and second fields, and wherein the method further comprises:
aligning the radiation path with the first field;
moving the reticle and the microlithographic substrate relative to each other while the radiation path is aligned with the first field;
repositioning at least one of the microlithographic substrate and the radiation path relative to the other to align the radiation path with the second field; and
moving the reticle and the microlithographic substrate relative to each other while the radiation path is aligned with the second field.

30. The method of claim 20, further comprising selecting the first direction to be approximately parallel to the second direction.

31. An apparatus for exposing a radiation-sensitive material of a microlithographic substrate to a selected radiation, comprising:
a radiation source positioned to direct a selected radiation along a radiation path;
a reticle positioned in the radiation path, the reticle being configured to selectively direct at least a portion of the radiation toward a microlithographic substrate, the reticle being coupled to at least one actuator to move relative to the radiation path in a direction generally perpendicular to the radiation path; and
a substrate support having a support surface positioned to support a microlithographic substrate in the radiation path with the microlithographic substrate receiving radiation from the reticle, wherein the substrate support is coupled to at least one actuator to move relative to the radiation path along a substrate support path, the substrate support path having a first component generally parallel to the radiation path proximate to the substrate support, the substrate support path having a second component generally perpendicular to the radiation path proximate to the substrate support, the substrate support being movable along both the first and second components of the substrate support path while the reticle moves along the reticle path, and wherein the substrate support is coupled to at least one actuator to oscillate toward and away from the reticle along a first axis generally parallel to the second direction while moving along a second axis generally perpendicular to the second direction.

32. The apparatus of claim 31 wherein the substrate support is coupled to at least one actuator to move simultaneously along both the first and second components of the substrate support path while the reticle moves along the reticle path.

33. The apparatus of claim 31 wherein the radiation includes a radiation beam having a beam width proximate to the substrate support surface and wherein the substrate support is coupled to at least one actuator to oscillate in a periodic manner toward and away from the reticle along an axis generally parallel to the second direction, further wherein the substrate support is configured to move for one period during the time the substrate support moves transverse to the beam by a distance of approximately one beam width.

34. The apparatus of claim 31 wherein the radiation includes a radiation beam having a beam width proximate to the substrate support surface and wherein the substrate support is configured to oscillate in a periodic manner toward and away from the reticle along an axis generally parallel to the second direction, further wherein the substrate support is configured to move for an integer number of periods during the time the substrate support moves transverse to the beam by a distance of approximately one beam width.

35. The apparatus of claim 31 wherein the radiation source is configured to emit radiation having a wavelength of from about 13 nanometers or less to about 365 nanometers.

36. The apparatus of claim 31 wherein a plane of the reticle is oriented approximately normal to the first direction.

37. The apparatus of claim 31 wherein the substrate support is configured to move simultaneously parallel to and perpendicular to the second direction.

38. The apparatus of claim 31 wherein the reticle is coupled to at least one actuator to move in a direction opposite to the second component of motion of the substrate support.

39. The apparatus of claim 31 wherein the substrate support is coupled to at least one actuator to move along a curved path.

40. The apparatus of claim 31 wherein the substrate support is coupled to at least one actuator to move along a straight path having a first segment directed toward the reticle and a second segment directed away from the reticle.

41. The apparatus of claim 31 wherein the substrate support is coupled to at least one actuator to move along a path describing a square wave.

42. The apparatus of claim 31 wherein the substrate support is coupled to at least one actuator to move along a path describing a sinusoidal wave.

43. The apparatus of claim 31 wherein the substrate support is coupled to at least one actuator to move along a path describing a periodic, triangular profile.

44. The apparatus of claim 31 wherein the microlithographic substrate has first and second fields, and wherein the reticle is coupled to at least one actuator to sequentially scan across the first and second fields.

45. The apparatus of claim 31 wherein the reticle includes a reticle aperture sized to pass a portion of the radiation toward the microlithographic substrate to form an image on the microlithographic substrate.

46. An apparatus for exposing a radiation-sensitive material of a microlithographic substrate to a selected radiation, comprising:
  a source of radiation positioned to direct a beam of selected radiation along a radiation path;
  a substrate support having a support surface positioned to support a microlithographic substrate in the radiation path, wherein the substrate support is coupled to at least one actuator to move relative to the radiation path along a substrate support path, the substrate support path having a first component generally parallel to the radiation path proximate to the substrate support, the substrate support path having a second component generally perpendicular to the radiation path proximate to the substrate support, the substrate support being movable along both the first and second components of the substrate support path to describe a periodic motion, the beam having a beam width proximate to the substrate support surface;
  a reticle positioned in the radiation path between the source of radiation and the substrate support to intersect the beam and direct at least a portion of the beam along the radiation path to the substrate support the reticle being coupled to at least one actuator to move relative to the radiation path in a direction generally perpendicular to the radiation path and opposite the first component of the substrate support path; and
  a controller operatively coupled to the reticle and the substrate support to move the substrate support for an integer number of periods during the time required for the microlithographic substrate to move transverse to the beam by at least one beam width.

47. The apparatus of claim 46 wherein the radiation source is configured to emit radiation having a wavelength of from about 13 nanometers or less to about 365 nanometers.

48. The apparatus of claim 46 wherein the substrate support is coupled to at least one actuator to move along a curved path.

49. The apparatus of claim 46 wherein the substrate support is coupled to at least one actuator to move along a straight path having a first segment directed toward the reticle and a second segment directed away from the reticle.

50. The apparatus of claim 46 wherein the substrate support is coupled to at least one actuator to move along a path describing a square wave.

51. The apparatus of claim 46 wherein the substrate support is coupled to at least one actuator to move along a path describing a sinusoidal wave.

52. The apparatus of claim 46 wherein the substrate support is coupled to at least one actuator to move along a path describing a periodic, triangular profile.

53. The apparatus of claim 46 wherein the reticle includes a reticle aperture sized to pass at least a portion of the radiation beam toward the substrate support to form an image on the microlithographic substrate.

54. An apparatus for exposing a radiation-sensitive material of a microlithographic substrate to a selected radiation, comprising:
  a source of radiation positioned to direct a beam of selected radiation along a radiation path;
  a substrate support configured to support a microlithographic substrate in the radiation path, wherein the substrate support is coupled to at least one actuator to move relative to the radiation path along a substrate support path, the substrate support path having a first component generally parallel to the radiation path proximate to the substrate support, the substrate support path having a second component generally perpendicular to the radiation path proximate to the substrate support, the substrate support being simultaneously movable along both the first and second components of the substrate support path to describe a periodic motion, the beam having a beam width proximate to the substrate support; and
  a reticle positioned in the radiation path between the source of radiation and the substrate support to intersect the radiation beam, the reticle including at least one aperture and being positioned to pass the radiation along the radiation path to the substrate support, the reticle being coupled to at least one actuator to move relative to the radiation path in a direction generally perpendicular to the radiation path and opposite the first component of the substrate support path; and
  a controller operatively coupled to the reticle and the substrate support to move the substrate support for an integer number of periods during the time required for the entire width of the beam to pass over a point on the microlithographic substrate.

55. The apparatus of claim 54 wherein the radiation source is configured to emit radiation having a wavelength of from about 13 nanometers or less to about 365 nanometers.

56. The apparatus of claim 54 wherein the substrate support is coupled to at least one actuator to move along a curved path.

57. The apparatus of claim 54 wherein the substrate support is coupled to at least one actuator to move along a straight path having a first segment directed toward the reticle and a second segment directed away from the reticle.

58. The apparatus of claim 54 wherein the substrate support is coupled to at least one actuator to move along a path describing a square wave.

59. The apparatus of claim 54 wherein the substrate support is coupled to at least one actuator to move along a path describing a sinusoidal wave.

60. The apparatus of claim 54 wherein the substrate support is coupled to at least one actuator to move along a path describing a periodic, triangular profile.

61. A method for exposing a radiation-sensitive material of a microlithographic substrate to a selected radiation, comprising:
  directing the radiation along a reticle radiation path segment toward a reticle;
  passing the radiation from the reticle and to the microlithographic substrate along a substrate radiation path segment at the microlithographic substrate, the radiation including a beam having a beam width at the microlithographic substrate;

moving the reticle along a reticle path generally normal to the reticle radiation path segment; and moving the microlithographic substrate relative to the radiation path along a substrate path, the substrate path having a first component generally parallel to the substrate radiation path segment, and the substrate path having a second component generally perpendicular to the substrate radiation path segment, the microlithographic substrate moving generally parallel to and generally perpendicular to the substrate radiation path segment toward and away from the reticle while the reticle moves along the reticle path, and wherein the microlithographic substrate oscillates toward and away from the reticle along an axis generally parallel to the substrate radiation path segment, further wherein a motion of the microlithographic substrate is periodic and wherein moving the microlithographic substrate includes moving the microlithographic substrate for one period during the time the microlithographic substrate moves transverse to the beam by a distance of one beam width or about one beam width.

62. A method for exposing a radiation-sensitive material of a microlithographic substrate to a selected radiation, comprising:

directing the radiation along a reticle radiation path segment toward a reticle;

passing the radiation from the reticle and to the microlithographic substrate along a substrate radiation path segment at the microlithographic substrate, the radiation including a beam having a beam width at least proximate to an intersection between the beam and the microlithographic substrate;

moving the reticle along a reticle path generally normal to the reticle radiation path segment; and moving the microlithographic substrate relative to the radiation path along a substrate path, the substrate path having a first component generally parallel to the substrate radiation path segment, and the substrate path having a second component generally perpendicular to the substrate radiation path segment, wherein the microlithographic substrate moves generally parallel to and generally perpendicular to the substrate radiation path segment toward and away from the reticle while the reticle moves along the reticle path, and wherein the microlithographic substrate oscillates toward and away from the reticle along an axis generally parallel to the substrate radiation path segment, further wherein a motion of the microlithographic substrate is periodic and wherein moving the microlithographic substrate includes moving the microlithographic substrate for an integer number of periods during the time the microlithographic substrate moves transverse to the beam by a distance of one beam width or about one beam width.

63. A method for exposing a radiation-sensitive material of a microlithographic substrate, to a selected radiation, comprising:

directing the radiation along a reticle radiation path segment toward a reticle;

passing the radiation from the reticle and to the microlithographic substrate along a substrate radiation path segment at the microlithographic substrate;

moving the reticle along a reticle path generally normal to the reticle radiation path segment; and moving the microlithographic substrate relative to the radiation path along a substrate path describing a square wave, the substrate path having a first component generally parallel to the substrate radiation path segment, and the substrate path having a second component generally perpendicular to the substrate radiation path segment, wherein the microlithographic substrate moves generally parallel to and generally perpendicular to the substrate radiation path segment toward and away from the reticle while the reticle moves along the reticle path.

64. A method for exposing a radiation-sensitive material of a microlithographic substrate to a selected radiation, comprising:

directing the radiation along a reticle radiation path segment toward a reticle;

passing the radiation from the reticle and to the microlithographic substrate along a substrate radiation path segment at the microlithographic substrate;

moving the reticle along a reticle path generally normal to the reticle radiation path segment; and moving the microlithographic substrate relative to the radiation path along a substrate path describing a sinusoidal wave, the substrate path having a first component generally parallel to the substrate radiation path segment, and the substrate path having a second component generally perpendicular to the substrate radiation path segment, wherein the microlithographic substrate moves generally parallel to and generally perpendicular to the substrate radiation path segment toward and away from the reticle while the reticle moves along the reticle path.

65. A method for exposing a radiation-sensitive material of a microlithographic substrate to a selected radiation, comprising:

directing the radiation along a reticle radiation path segment toward a reticle;

passing the radiation from the reticle and to the microlithographic substrate along a substrate radiation path segment at the microlithographic substrate;

moving the reticle along a reticle path generally normal to the reticle radiation path segment; and moving the microlithographic substrate relative to the radiation path along a substrate path describing a periodic, triangular profile, the substrate path having a first component generally parallel to the substrate radiation path segment, and the substrate path having a second component generally perpendicular to the substrate radiation path segment, wherein the microlithographic substrate moves generally parallel to and generally perpendicular to the substrate radiation path segment toward and away from the reticle while the reticle moves along the reticle path.

66. An apparatus for exposing a radiation-sensitive material of a microlithographic substrate to a selected radiation, comprising:

a radiation source positioned to direct a selected radiation along a radiation path;

a reticle positioned in the radiation path, the reticle being configured to selectively direct at least a portion of the radiation toward a microlithographic substrate, the reticle being coupled to at least one actuator to move relative to the radiation path in a direction generally perpendicular to the radiation path; and a substrate support having a support surface positioned to support a microlithographic substrate in the radiation path with the microlithographic substrate receiving radiation from the reticle, the radiation including a radiation beam having a beam width proximate to the substrate support surface, wherein the substrate support is coupled to at least one actuator to move relative to the radiation path along a substrate support path, the substrate support path having a first component generally parallel to the radiation path proximate to the substrate support, the substrate support path having a second component generally perpendicular to the radiation path proximate to the substrate support, the substrate support being movable along both the first and second components of the substrate support path while the reticle moves along the reticle path, and wherein the substrate support is coupled to at least one actuator to oscillate in a periodic manner toward and away from the reticle along an axis generally parallel to the second direction, further wherein the substrate support is configured to move for one period during the time the substrate support moves transverse to the beam by a distance of approximately one beam width.

67. An apparatus for exposing a radiation-sensitive material of a microlithographic substrate to a selected radiation, comprising:

a radiation source positioned to direct a selected radiation along a radiation path;

a reticle positioned in the radiation path, the reticle being configured to selectively direct at least a portion of the radiation toward a microlithographic substrate, the reticle being coupled to at least one actuator to move relative to the radiation path in a direction generally perpendicular to the radiation path; and a substrate support having a support surface positioned to support a microlithographic substrate in the radiation path with the microlithographic substrate receiving radiation from the reticle, the radiation including a radiation beam having a beam width proximate to the substrate support surface, wherein the substrate support is coupled to at least one actuator to move relative to the radiation path along a substrate support path, the substrate support path having a first component generally parallel to the radiation path proximate to the substrate support, the substrate support path having a second component generally perpendicular to the radiation path proximate to the substrate support, the substrate support being movable along both the first and second components of the substrate support path while the reticle moves along the reticle path, and wherein the substrate support is configured to oscillate in a periodic manner toward and away from the reticle along an axis generally parallel to the second direction, further wherein the substrate support is configured to move for an integer number of periods during the time the substrate support moves transverse to the beam by a distance of approximately one beam width.

68. An apparatus for exposing a radiation-sensitive material of a microlithographic substrate to a selected radiation, comprising:

a radiation source positioned to direct a selected radiation along a radiation path;

a reticle positioned in the radiation path, the reticle being configured to selectively direct at least a portion of the radiation toward a microlithographic substrate, the reticle being coupled to at least one actuator to move relative to the radiation path in a direction generally perpendicular to the radiation path; and a substrate support having a support surface positioned to support a microlithographic substrate in the radiation path with the microlithographic substrate receiving radiation from the reticle, wherein the substrate support is coupled to at least one actuator to move relative to the radiation path along a substrate support path describing a square wave, the substrate support path having a first component generally parallel to the radiation path proximate to the substrate support, the substrate support path having a second component generally perpendicular to the radiation path proximate to the substrate support, the substrate support being movable along both the first and second components of the substrate support path while the reticle moves along the reticle path.

69. An apparatus for exposing a radiation-sensitive material of a microlithographic substrate to a selected radiation, comprising:

a radiation source positioned to direct a selected radiation along a radiation path;

a reticle positioned in the radiation path, the reticle being configured to selectively direct at least a portion of the radiation toward a microlithographic substrate, the reticle being coupled to at least one actuator to move relative to the radiation path in a direction generally perpendicular to the radiation path; and a substrate support having a support surface positioned to support a microlithographic substrate in the radiation path with the microlithographic substrate receiving radiation from the reticle, wherein the substrate support is coupled to at least one actuator to move relative to the radiation path along a substrate support path describing a sinusoidal wave, the substrate support path having a first component generally parallel to the radiation path proximate to the substrate support, the substrate support path having a second component generally perpendicular to the radiation path proximate to the substrate support, the substrate support being movable along both the first and second components of the substrate support path while the reticle moves along the reticle path.

70. An apparatus for exposing a radiation-sensitive material of a microlithographic substrate to a selected radiation, comprising:

a radiation source positioned to direct a selected radiation along a radiation path;

a reticle positioned in the radiation path, the reticle being configured to selectively direct at least a portion of the radiation toward a microlithographic substrate, the reticle being coupled to at least one actuator to move relative to the radiation path in a direction generally perpendicular to the radiation path; and a substrate support having a support surface positioned to support a microlithographic substrate in the radiation path with the microlithographic substrate receiving radiation from the reticle, wherein the substrate support is coupled to at least one actuator to move relative to the radiation path along a substrate support path describing a periodic, triangular profile, the substrate support path having a first component generally parallel to the radiation path proximate to the substrate support, the substrate support path having a second component generally perpendicular to the radiation path proximate to the substrate support, the substrate support being movable along both the first and second components of the substrate support path while the reticle moves along the reticle path.

* * * * *